(12) United States Patent
Harada et al.

(10) Patent No.: US 10,418,591 B2
(45) Date of Patent: Sep. 17, 2019

(54) LIGHT EMITTING DEVICE

(71) Applicant: Koito Manufacturing Co., Ltd., Tokyo (JP)

(72) Inventors: Tomoaki Harada, Shizuoka (JP); Masaya Shido, Shizuoka (JP); Yoshiro Ito, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/623,624

(22) Filed: Jun. 15, 2017

(65) Prior Publication Data

US 2017/0373278 A1  Dec. 28, 2017

(30) Foreign Application Priority Data

Jun. 27, 2016 (JP) ................. 2016-126898

(51) Int. Cl.
| | |
|---|---|
| *H01L 31/12* | (2006.01) |
| *H01L 51/52* | (2006.01) |
| *H01L 51/00* | (2006.01) |
| *F21V 21/08* | (2006.01) |
| *F21S 43/19* | (2018.01) |
| *F21S 43/145* | (2018.01) |
| *F21S 43/20* | (2018.01) |
| *F21S 43/31* | (2018.01) |
| *F21S 43/33* | (2018.01) |

(52) U.S. Cl.
CPC ........ *H01L 51/5265* (2013.01); *F21S 43/145* (2018.01); *F21S 43/19* (2018.01); *F21S 43/26* (2018.01); *F21S 43/315* (2018.01); *F21S 43/33* (2018.01); *F21V 21/0808* (2013.01); *H01L 51/0096* (2013.01); *H01L 51/524* (2013.01); *H01L 51/5206* (2013.01); *H01L 51/5221* (2013.01); *H01L 51/5225* (2013.01); *H01L 51/5271* (2013.01)

(58) Field of Classification Search
CPC ........ H01L 31/12; H01L 51/50; H01L 25/048
See application file for complete search history.

(56) References Cited

U.S. PATENT DOCUMENTS

| | | | |
|---|---|---|---|
| 2008/0061683 A1* | 3/2008 | Bertram | H01L 51/5271 313/504 |
| 2014/0008625 A1* | 1/2014 | Hiraoka | H01L 51/56 257/40 |

FOREIGN PATENT DOCUMENTS

| | | |
|---|---|---|
| JP | 11-198720 A | 7/1999 |
| JP | 2015-195173 A | 11/2015 |

(Continued)

OTHER PUBLICATIONS

An Office Action dated Jun. 28, 2018, issued from the Korean Intellectual Property Office (KIPO) of Korean Patent Application No. 10-2017-0078035 and an English translation thereof.

*Primary Examiner* — Mohammad M Choudhry
(74) *Attorney, Agent, or Firm* — Abelman, Frayne & Schwab

(57) ABSTRACT

Provided is a light emitting device disposed along a transparent member. The light emitting device includes: an organic electroluminescence panel having a translucent substrate disposed to face the transparent member, a translucent anode disposed on the substrate, an organic material layer disposed on the anode, and a non-translucent cathode disposed on the organic material layer. The organic material layer and the cathode are formed in a form of stripes. The cathode is formed wider than the organic material layer.

13 Claims, 9 Drawing Sheets

(56) References Cited

FOREIGN PATENT DOCUMENTS

| KR | 10-2008-0037062 A | 4/2008 |
|---|---|---|
| KR | 10-2009-0111634 A | 10/2009 |
| KR | 10-2010-0106693 A | 10/2010 |

\* cited by examiner

LIGHT EMITTING DEVICE

CROSS-REFERENCE TO RELATED APPLICATIONS

This application is based on and claims priority from Japanese Patent Application No. 2016-126898, filed on Jun. 27, 2016 with the Japan Patent Office, the disclosure of which is incorporated herein in its entirety by reference.

TECHNICAL FIELD

The present disclosure relates to a light emitting device using an organic electroluminescence (EL).

BACKGROUND

It has been conventionally proposed to dispose an organic EL panel inside a rear window of a vehicle and use it as a marker lamp, such as a high mount stop lamp or a tail lamp (see, for example, Japanese Patent Laid-open Publication No. 11-198720).

When disposing the organic EL panel inside the rear window, it is required to irradiate the light only to the front side (that is, the rear window side) of the organic EL panel in order to prevent light emitted in the organic EL panel from becoming glare light and dazzling the driver. Also, in order to suppress rearward visibility from deteriorating due to the presence of the organic EL panel, it is required to configure the organic EL panel so that the rear side can be seen through. For these purposes, it has been proposed to configure an organic EL panel to have a light transmission property by forming cathodes in the form of stripes (see, e.g., Japanese Patent Laid-open Publication No. 2015-195173).

SUMMARY

In the organic EL panel in which the cathodes are formed in the form of stripes as described above, there is a possibility that a part of the light reflected from the surface of the organic EL panel leaks from the region between the cathodes to the rear side of the organic EL panel to dazzle the driver.

The present disclosure is made in consideration of such a circumstance, and provides a technology capable of suppressing, in a light emitting device using an organic EL having a light transmission property, light reflected from the surface of the organic EL panel from leaking to the rear side.

In order to solve the above-mentioned problems, a light emitting device of one embodiment of the present disclosure is a light emitting device disposed along a transparent member, the light emitting device including: an organic EL panel having a translucent substrate disposed to face the transparent member, a translucent anode disposed on the substrate, an organic material layer disposed on the anode, and a non-translucent cathode disposed on the organic material layer. The organic material layer and the cathode are formed in a form of stripes, and the anode is formed wider than the organic material layer.

Assuming that a reflective index of the substrate is $n_1$ and a thickness of the substrate is d, a width $L_N$ of the portion wider than the organic material layer in the cathode may be defined as $L_N \geq 2$ d tan(arc sin(1/$n_1$)).

Another embodiment of the present disclosure is also a light emitting device. This device is a light emitting device disposed along a transparent member, the light emitting device including: an organic EL panel having a translucent substrate disposed to face the transparent member, a translucent anode disposed on the substrate, an organic material layer disposed on the anode, a non-translucent cathode disposed on the organic material layer, a sealing member that covers the organic material layer and the cathode, and a light shielding film formed on the sealing member. The organic material layer, the cathode, and the light shielding film are formed in a form of stripes, and the light shielding film is formed wider than the organic material layer.

Assuming that a reflective index of the substrate is $n_1$, a thickness of the substrate is d, and a thickness of the sealing member is D, a width $L_F$ of the portion wider than the organic material layer in the light shielding film may be defined as $L_F \geq 2$ d tan(arc sin(1/$n_1$))+D tan(arc sin(1/$n_1$)).

An attachment structure may be provided for attaching the organic EL panel to the transparent member so that a layer of materials having a lower reflective index than that of the substrate is formed between the transparent member and the substrate.

The organic EL panel may have a microcavity structure in which a half mirror, an anode, an organic material layer, and a cathode are laminated in this order on the substrate.

In the light emitting device using an organic EL having a light transmission according to the present disclosure, the light reflected on the surface of the organic EL panel may be kept from leaking to the rear side.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
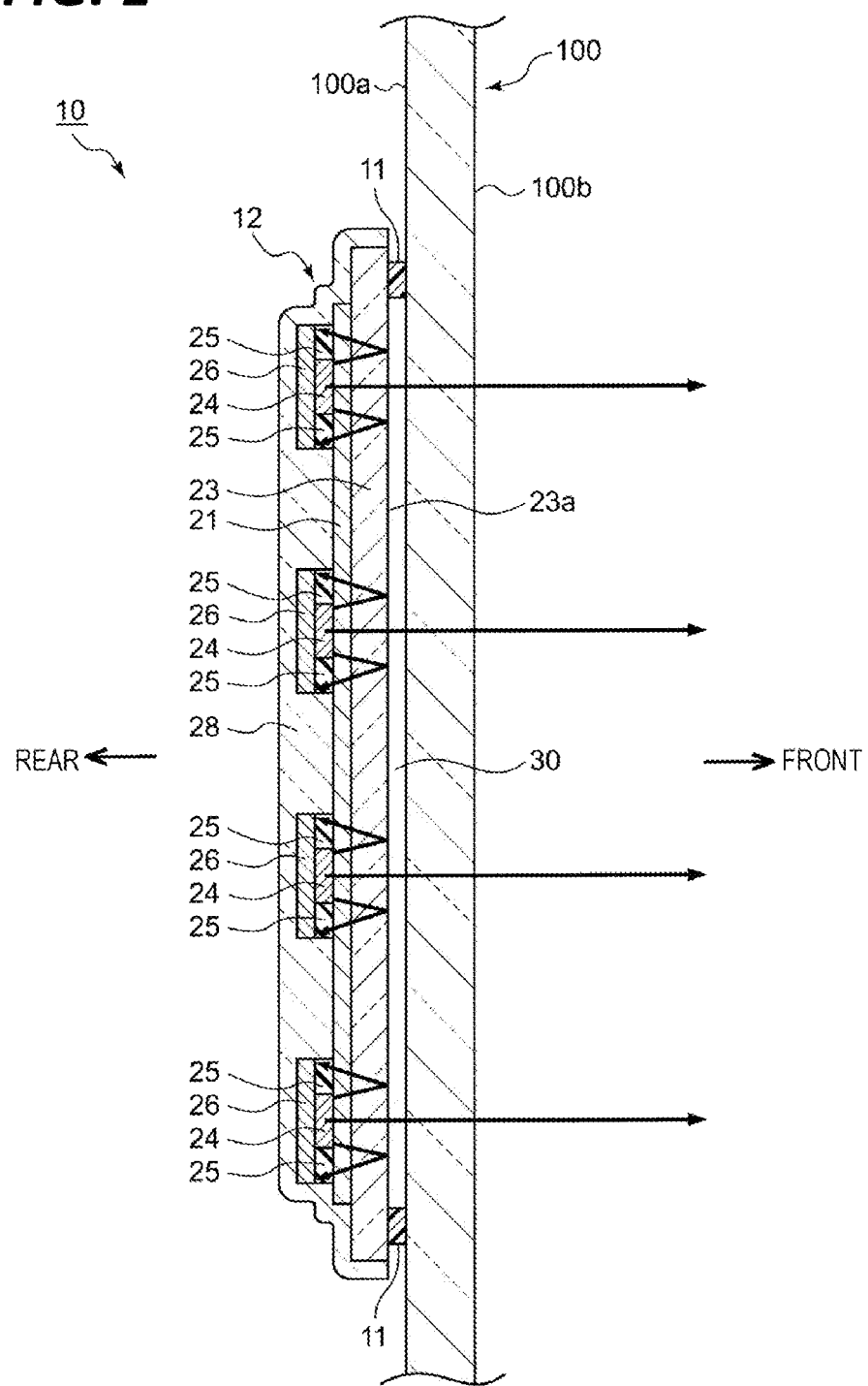
FIG. 1 is a schematic cross-sectional view of a light emitting device according to an exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

A light emitting device according to exemplary embodiments of the present disclosure will be described in detail with reference to the drawings. Further, since each drawing is intended to explain the positional relationship of respective members, it does not necessarily indicate the actual dimensional relationship of respective members. In addition, in the description of each exemplary embodiment, the same reference numerals are given to the same or corresponding elements, and redundant descriptions will be omitted properly.

FIG. 1 is a schematic cross-sectional view of a light emitting device 10 according to an exemplary embodiment of the present disclosure. The light emitting device 10 illustrated in FIG. 1 may be used as a vehicular lamp such as, for example, a high mount stop lamp or a tail lamp.

As illustrated in FIG. 1, the light emitting device 10 is disposed along a transparent member 100 such as, for example, a rear window of a vehicle. The transparent member 100 has a first surface 100a to which the light emitting device 10 is attached and a second surface 100b that is opposite the first surface 100a. When the transparent member 100 is the rear window of a vehicle, the first surface 100a is the inner surface of the rear window and the second surface 100b is the outer surface of the rear window.

The light emitting device 10 includes an organic EL panel 12 and a double-sided tape 11 as an attachment structure for attaching the organic EL panel 12 to the transparent member 100.

The organic EL panel 12 includes a translucent substrate 23 disposed to face the transparent member 100, a translucent anode 21 disposed on the substrate 23, organic material layers 24 disposed on the anode 21, non-translucent cathodes 26 disposed on the organic material layer 24, an anode 21, and a sealing member 28 that covers the organic material layers 24 and the cathodes 26. The sealing member 28 may be, for example, silicon oxide.

The organic EL panel 12 is attached to the first surface 100a of the transparent member 100 by the double-sided tape 11 attached along the peripheral edge of the substrate 23. Due to the thickness of the double-sided tape 11, an air layer 30 is formed between the substrate 23 and the transparent member 100.

As the anode 21, a transparent electrode formed of indium tin oxide (ITO) or the like is used. As the cathodes 26, a non-translucent metal electrode formed of aluminum or the like is used. When a voltage is applied to the organic material layers 24 using the anode 21 and the cathodes 26, holes are injected from the anode 21 and electrons are injected from the cathodes 26, and a fluorescent organic compound is excited by the energy generated when the holes and the electrons are bonded in the organic material layer 24, thereby emitting light. Among the light emitted from the organic material layers 24, the light directed to the anode 21 passes through the anode 21 and is emitted from a light emitting surface 23a of the substrate 23. In the meantime, among the light emitted from the organic material layer 24, the light directed to the cathodes 26 is reflected from the cathodes 26, passes through the organic material layer 24 and the cathodes 26, and is emitted from the light emitting surface 23a of the substrate 23. In this way, the organic EL panel 12 basically emits light only to one side direction (referred to as "forward"). The light emitted from the light emitting surface 23a of the substrate 23 passes through the air layer 30, is incident on the transparent member 100 from the first surface 100a, and is emitted from the second surface 100b.

As illustrated in FIG. 1, the organic material layers 24 and the cathodes 26 are formed in the form of stripes. That is, a plurality of columnar organic material layers 24 and cathodes 26 are arranged side by side at a predetermined interval. By forming the organic material layers 24 and the cathodes 26 in the form of stripes in this way, the interior of the light emitting device 10 may be seen through the regions where the organic material layers 24 and the cathodes 26 are not formed. As a result, when the light emitting device 10 is disposed along the rear window of a vehicle, rearward visibility from a driver's seat may be ensured.

As illustrated in FIG. 1, in the light emitting device 10 according to the exemplary embodiment, the cathodes 26 are formed wider than the organic material layers 24. That is, an end portion of each cathode 26 extends greater than an end portion of each organic material layer 24 in a width direction. An insulating layer 25 is formed between the anode 21 and a portion wider than each organic material layer 24 in each cathode 26. That is, insulating layers 25 are formed on opposite sides of an organic material layer 24, and a cathode 26 is provided on the organic material layer 24 and the insulating layers 25. The insulating layer 25 may be formed of, for example, $Ca(DPM)_2$.

A part of the light emitted in the organic material layers 24 is reflected from the light emitting surface 23a of the substrate 23. Reflected light having a small incident angle to the light emitting surface 23a is shielded by a cathode 26. However, reflected light having a large incident angle passes through a region between every two adjacent columnar cathodes 26 without being shielded by the cathodes 26, and thus, may leak to the rear side of the organic EL panel 12. In the light emitting device 10 according to the exemplary embodiment, since the cathodes 26 are formed to be wider than the organic material layers 24 as described above, the reflected light having a large reflection angle at the light emitting surface 23a is shielded by the wide portions of the cathodes 26. As a result, the reflected light at the light emitting surface 23a of the substrate 23 may be prevented or at least suppressed from leaking to the rear side of the organic EL panel 12. When the light emitting device 10 is disposed along the rear window of the vehicle, the light emitted by the light emitting device 10 of the vehicle is hardly directed toward the driver's seat so that dazzling the driver may be prevented.

Figure 2:
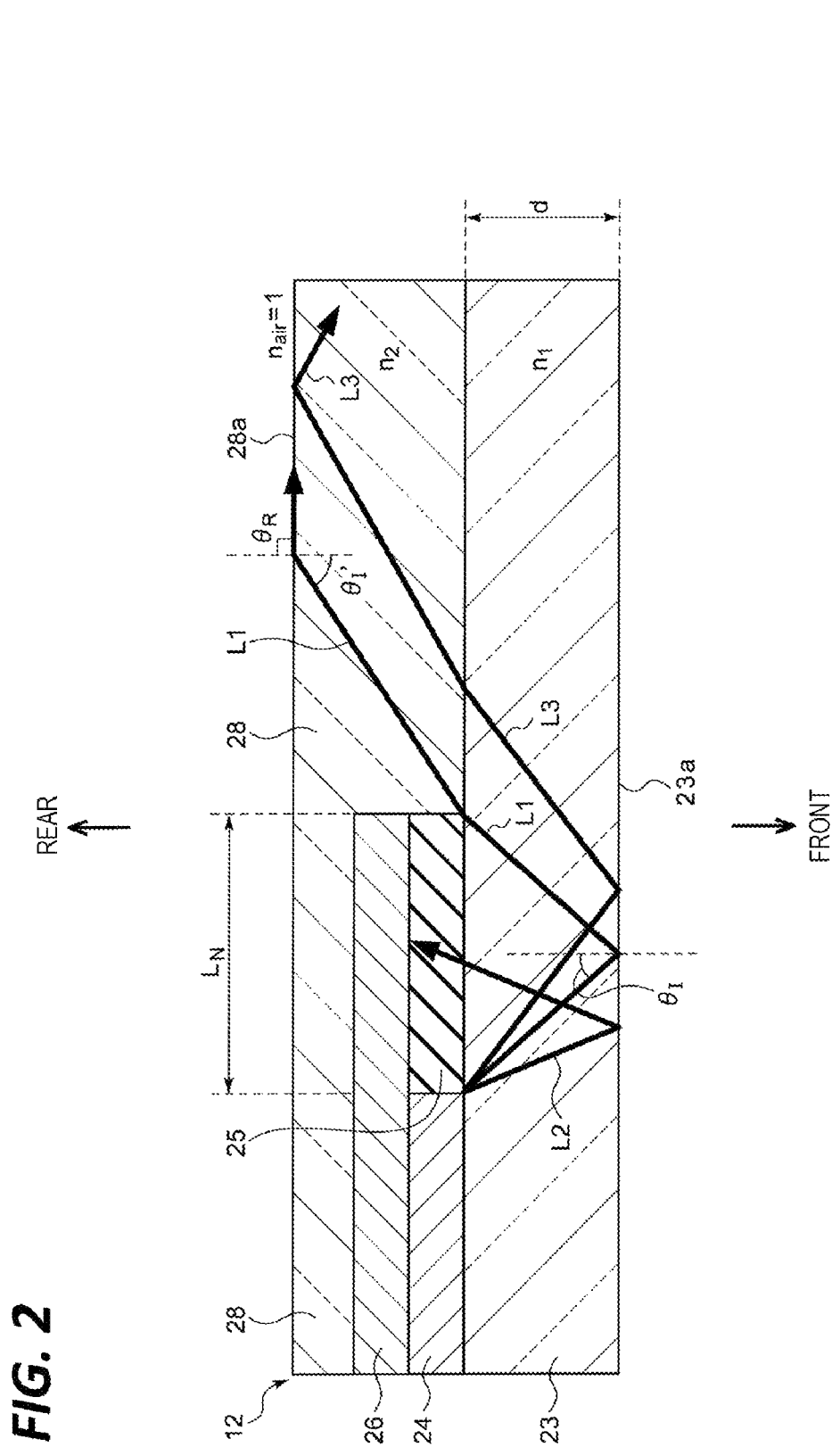
FIG. 2 is a view for explaining a method of setting the width of a cathode.

FIG. 2 is a view for explaining a method of setting the width of a cathode 26. Here, since the reflected light reflected from the light emitting surface 23a of the substrate 23 does not leak to the rear side, the minimum required width of the cathode 26 is considered. Also, illustration of the anode is omitted for simplicity in FIG. 2.

As illustrated in FIG. 2, it is assumed that after being emitted from the end portion of the organic material layer 24, light L1 is incident on the light emitting surface 23a of the substrate 23 at an incident angle $(\theta_I)$, the light L1 is reflected. Then, the light L1 passing through the end portion of the cathode 26 is incident on an interface 28a between the sealing member 28 and air at an incident angle $(\theta_I')$ and is totally reflected (reflection angle $\theta_R=90°$. Since light L2 that is incident at an incident angle smaller than the incident angle of the light L1 on the light emitting surface 23a is shielded by the cathode 26, the light L2 does not leak to the rear side of the organic EL panel 12. In the meantime, since light L3 that is incident at an incident angle larger than the incident angle $(\theta_I)$ of the light L1 is reflected at the interface 28a of the sealing member 28, the light (L3) does not leak to the rear side of the organic EL panel 12.

It is assumed that the refractive index of the substrate 23 is $n_1$, the refractive index of the sealing member 28 is $n_2$, and the refractive index of air is $n_{air}=1$. Also, it is assumed that the thickness of the substrate 23 is d, and the width of the portion wider than the organic material layer 24 in the cathode 26 is $L_N$. At this time, the following expressions (1) to (3) are established.

$$L_N \geq 2 \; d \tan \theta_I \tag{1}$$

$$n_1 \sin \theta_I = n_2 \sin \theta_I' \tag{2}$$

$$n_2 \sin \theta_I' = n_{air} \sin \theta_R \tag{3}$$

From expressions (1) to (3), the following expression (4) may be derived.

$$L_N \geq 2 \; d \tan(\arc \sin(1/n_1)) \tag{4}$$

Thus, the light reflected from the light emitting surface 23a of the substrate 23 may be prevented from leaking to the rear side by setting the width $L_N$ of the wide portion of the cathode 26 to satisfy expression (4).

Figure 3:
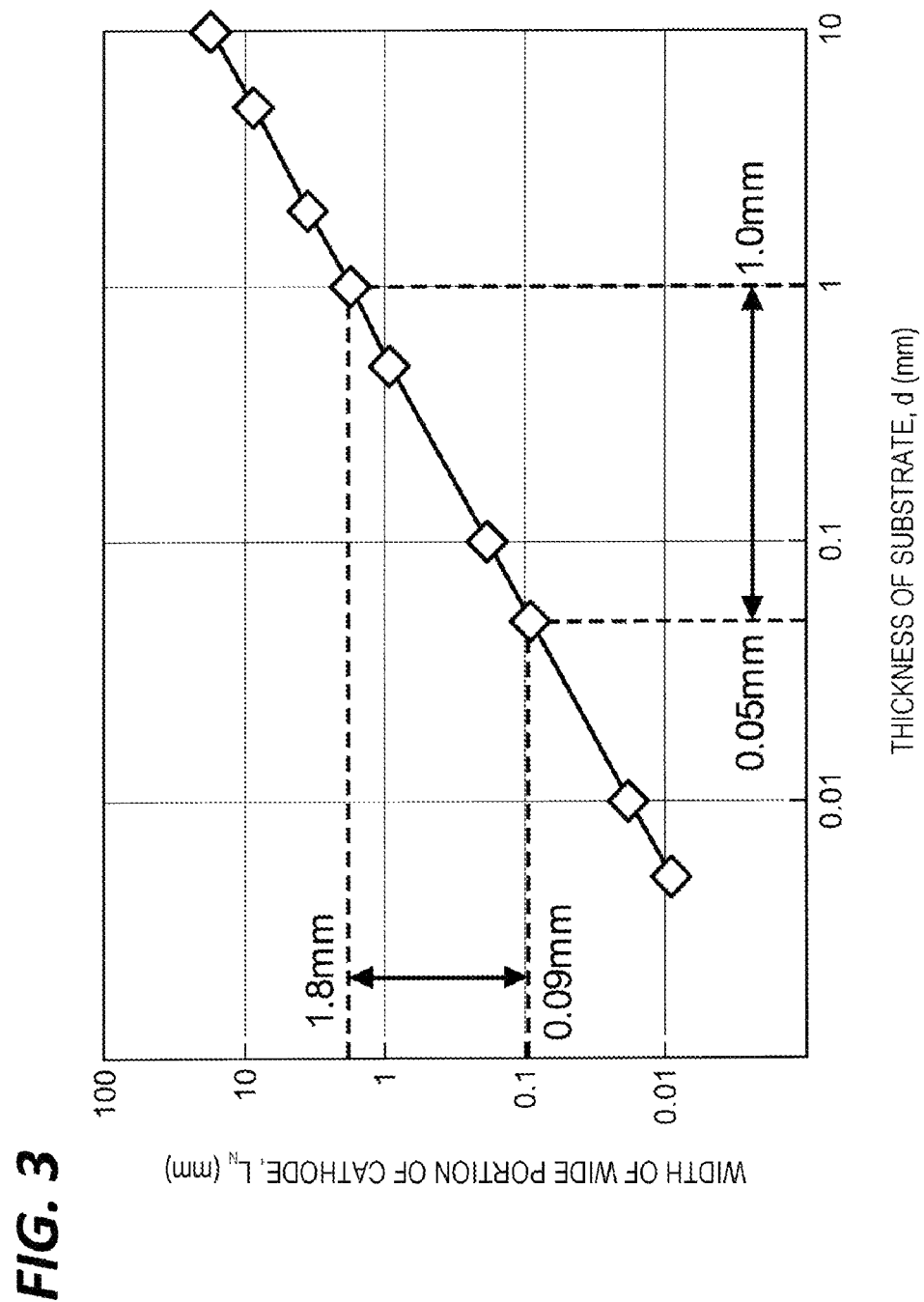
FIG. 3 is a view illustrating a relationship between the thickness of a substrate and the width of the wide portion of the cathode.

FIG. 3 is a view illustrating a relationship between the thickness d of the substrate 23 and the width $L_N$ of the wide portion of the cathode 26. In FIG. 3, $L_N=2 \; d \tan(\arc \sin(1/n_1))$ is plotted with $n_1=1.5$. As can be seen from FIG. 3, in order to prevent the reflected light from leaking to the rear side, it is necessary to increase the width $L_N$ of the wide portion of the cathode 26 as the thickness d of the substrate 23 increases. For example, when the thickness d of the substrate 23 is 0.05 mm to 1.0 mm, it is necessary to set the width $L_N$ of the wide portion of the cathode 26 to 0.09 mm to 1.8 mm or more.

Figure 4:
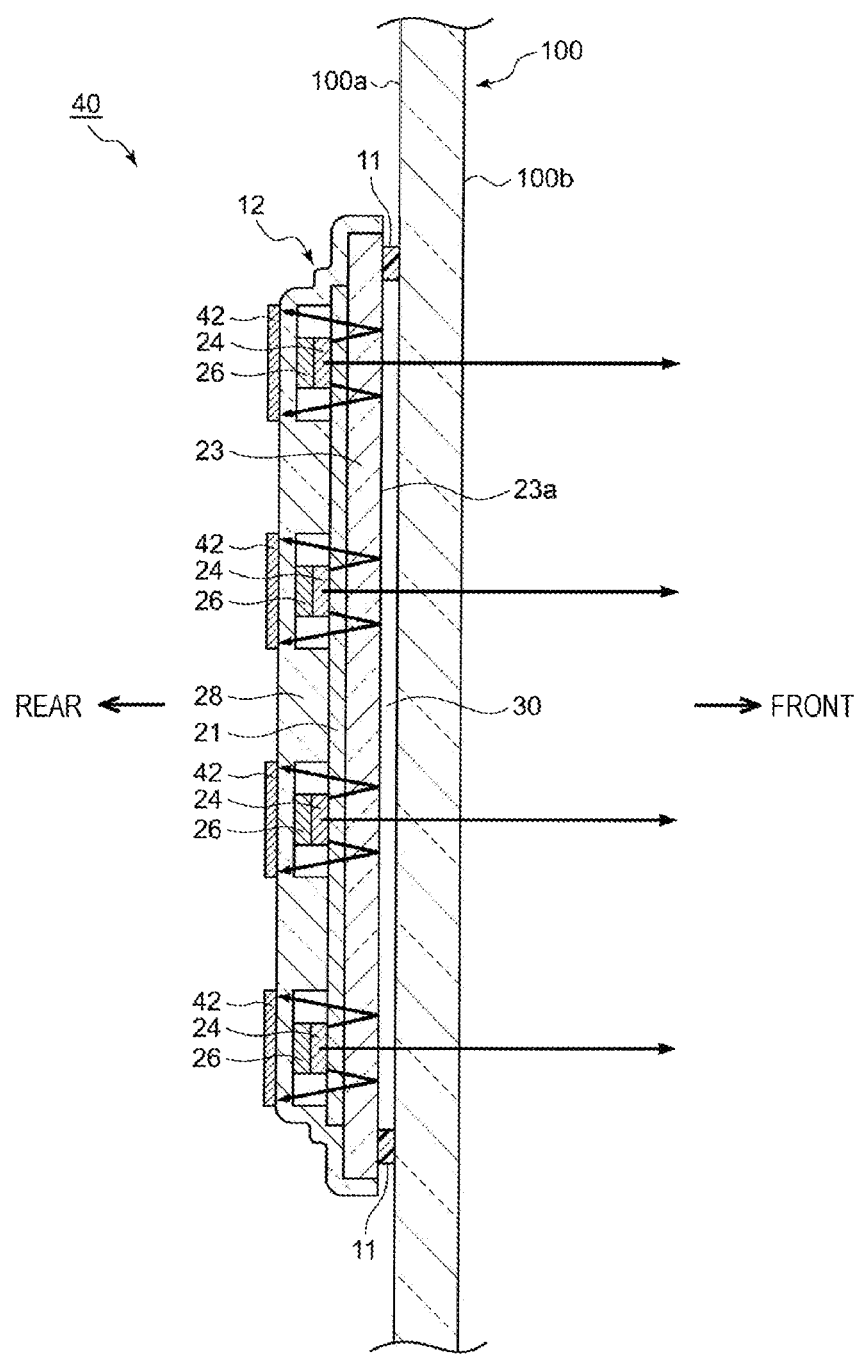
FIG. 4 is a schematic cross-sectional view of a light emitting device according to another exemplary embodiment of the present disclosure.

FIG. 4 is a schematic cross-sectional view of a light emitting device 40 according to another exemplary embodiment of the present disclosure. A light emitting device 100 illustrated in FIG. 4 is also disposed along a transparent member 100, such as the rear window of a vehicle, and may be used as a vehicular lamp, such as, for example, a high mount stop lamp or a tail lamp.

The light emitting device 40 includes an organic EL panel 12 and a double-sided tape 11 as an attachment structure in which the organic EL panel 12 is attached to the transparent member 100. Due to the thickness of the double-sided tape 11, an air layer 30 is formed between a substrate 23 and the transparent member 100.

The organic EL panel includes a translucent substrate 23 disposed to face a transparent member 100, a translucent anode 21 disposed on the substrate 23, organic material layers 24 disposed on the anode 21, non-translucent cathodes 26 disposed on the organic material layers 24, a sealing member 28 that covers the anode 21, the organic material layers 24, and the cathode 26, and light shielding films 42 formed on the sealing member 28. The light shielding films 42 may be formed of, for example, an adhesive sheet on which Al is deposited.

In the light emitting device 40 according to the exemplary embodiment, the organic material layers 24, the cathodes 26, and the light shielding films 42 are formed in the form of stripes. That is, a plurality of columnar organic material layers 24 and cathodes 26 are arranged side by side at a predetermined interval, and a columnar light shielding film 42 is formed with the sealing member 28 interposed above each columnar organic material layer 24 and each cathode 26. Thus, the interior of the light emitting device 40 can be seen through the regions where the organic material layers 24, the cathodes 26, and the light shielding films 42 are not formed. As a result, when the light emitting device 40 is disposed along the rear window of the vehicle, the rearward visibility from the driver's seat may be ensured.

As illustrated in FIG. 4, in the light emitting device 40 according to the exemplary embodiment, the cathodes 26 are formed to have the same width as the organic material layers 24. In the meantime, the light shielding films 42 are formed wider than the organic material layers 24. That is, an end portion of each light shielding film 42 extends greater than the end portion of each organic material layer 24 in a width direction.

A part of the light emitted in the organic material layers 24 is reflected from the light emitting surface 23a of the substrate 23. Reflected light having a small incident angle to the light emitting surface 23a is shielded by the cathodes 26. However, reflected light having a large incident angle is not shielded by the cathodes 26 and passes through the regions between the columnar cathodes 26, and thus, may leak to the rear side of the organic EL panel 12. In the light emitting device 40 according to the exemplary embodiment, the reflected light having a large incident angle at the light emitting surface 23a may be shielded by the wide portions of the light shielding films 42 by providing the light shielding films 42 in the form of stripes on the sealing member 28 and forming the light shielding films 42 to be wider than the organic material layers 24. As a result, the light reflected at the light emitting surface 23a of the substrate 23 may be prevented or at least suppressed from leaking to the rear side of the organic EL panel 12. When disposing the light emitting device 40 along the rear window of the vehicle, the light emitted by the light emitting device 40 of the vehicle is hardly directed toward the driver's seat so that dazzling the driver can be prevented.

Figure 5:
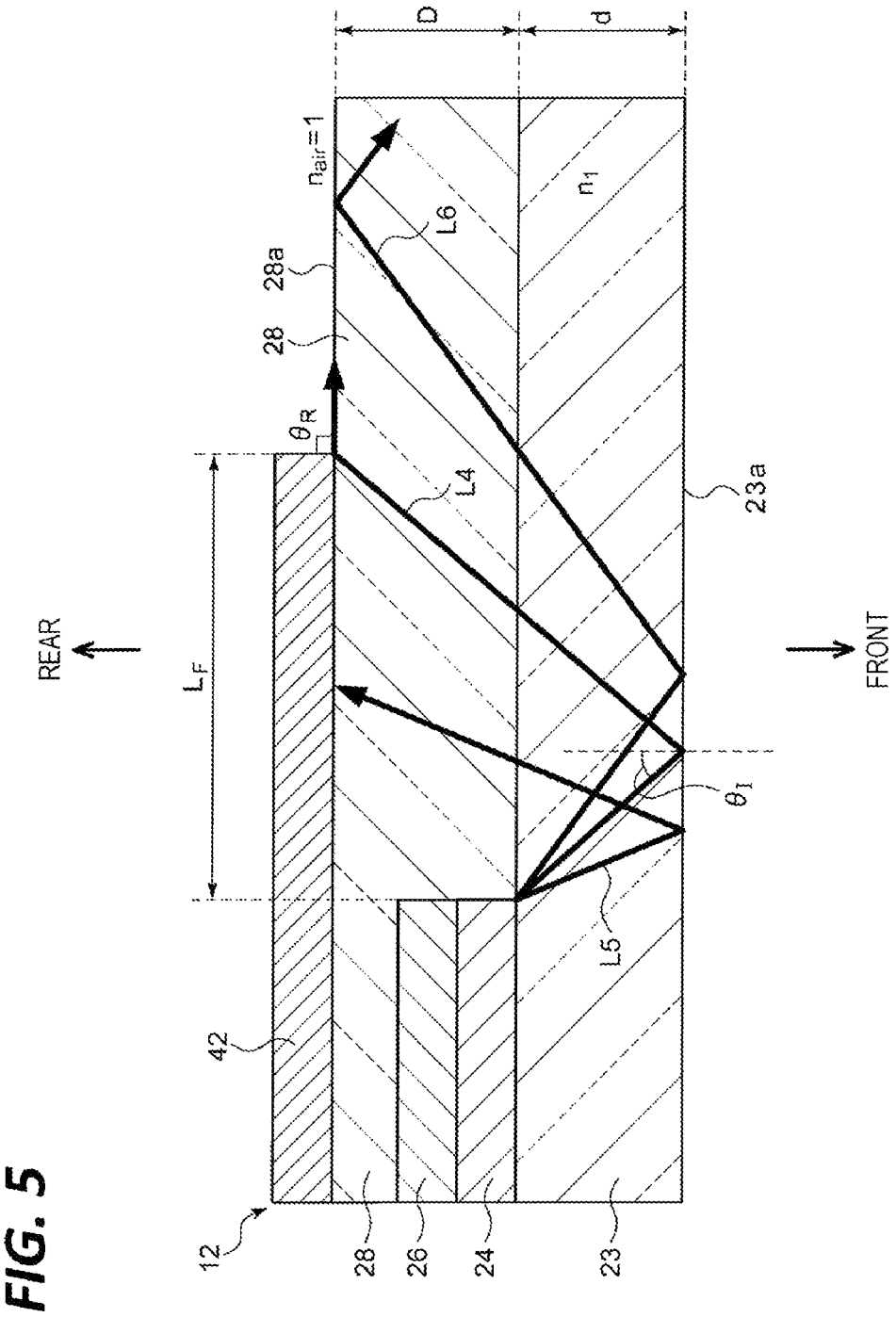
FIG. 5 is a view for explaining a method of setting the width of a light shielding film.

FIG. 5 is a view for explaining a method of setting the width of a light shielding film 42. Here, since the light reflected from the light emitting surface 23a of the substrate 23 does not leak to the rear side, the minimum required width of the light shielding film 42 is considered. Also, illustration of the anode is omitted for simplicity in FIG. 5.

As illustrated in FIG. 5, it is assumed that after being emitted from the end portion of the organic material layer 24, light L4 is incident on the light emitting surface 23a of the substrate 23 at an incident angle ($\theta_I$), and the light L4 is reflected. Then, the light L4 is totally reflected (reflection angle $\theta_R=90°$) at the end portion of the light shielding film 42 at the interface 28a between the sealing member 28 and air. Since light L5 that is incident on the light emitting surface 23a at an incident angle smaller than the incident angle ($\theta_I$) of the light L4 is shielded by the light shielding film 42, the light L5 does not leak to the rear side of the organic EL panel 12. In the meantime, since light L6 that is incident on the light emitting surface 23a at an incident angle larger than the incident angle ($\theta_I$) of the light L4 is reflected at the interface 28a of the sealing member 28, the light (L6) does not leak to the rear side of the organic EL panel 12.

It is assumed that the refractive index of the substrate 23 is $n_1$ and the refractive index of air is $n_{air}=1$. Also, it is assumed that the thickness of the substrate 23 is d, the thickness of the sealing member 28 is D, and the width of the wide portion from the organic material layer 24 in the light shielding film 42 is $L_F$. At this time, following expressions (5) and (6) are established.

$$L_F \geq 2 \; d \tan \theta_I + D \tan \theta_I \tag{5}$$

$$n_1 \sin \theta_I = \sin \theta_R \tag{6}$$

From expressions (5) and (6), the following expression (7) may be derived.

$$L_F \geq 2\,d\,\tan(\arcsin(1/n_1)) + D\,\tan(\arcsin(1/n_1)) \quad (7)$$

Thus, the light reflected from the light emitting surface 23a of the substrate 23 may be prevented from leaking to the rear side by setting the width LF of the wide portion of the light shielding film 42 to satisfy expression (7).

Figure 6:
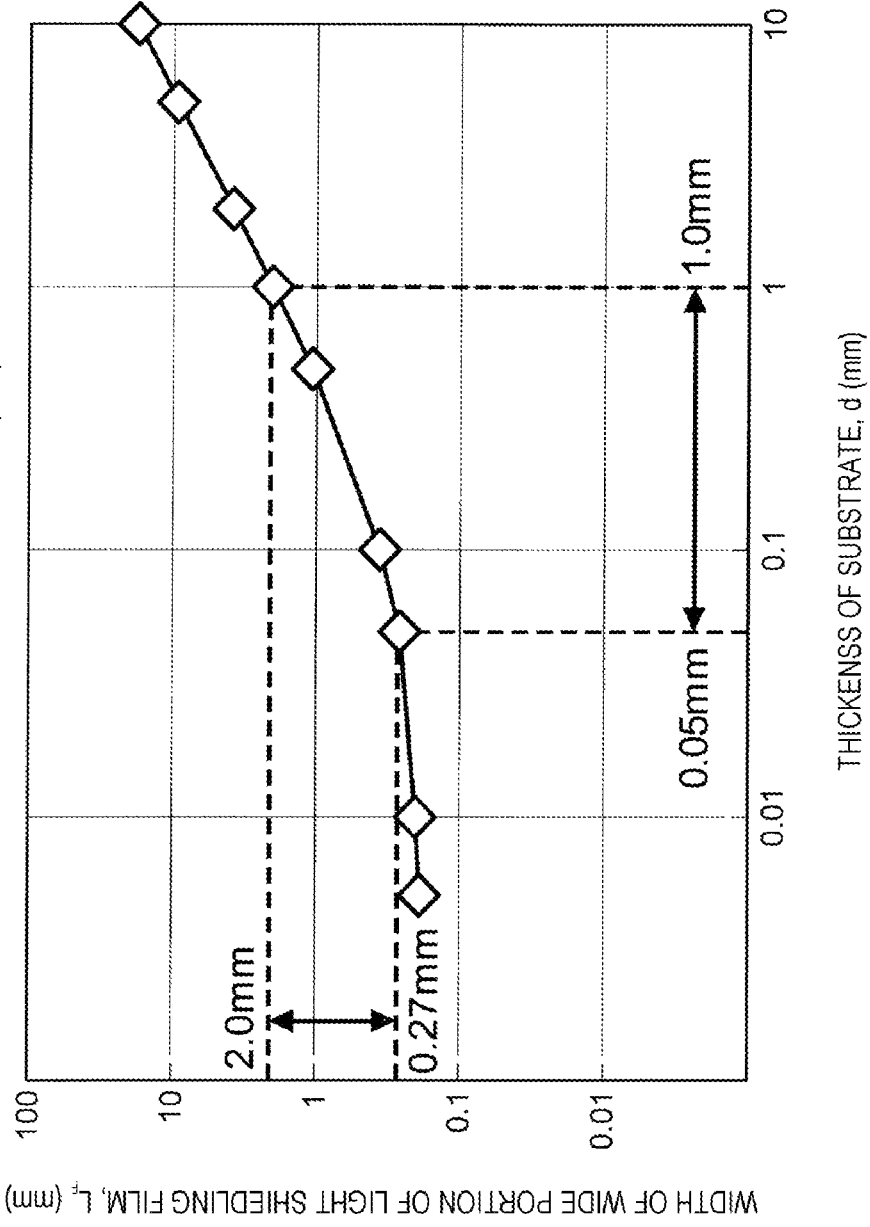
FIG. 6 is a view illustrating a relationship between the thickness of a substrate and the width of the wide portion of the light shielding film.

FIG. 6 is a view illustrating a relationship between the thickness d of the substrate 23 and the width $L_F$ of the wide portion of the light shielding film 42. In FIG. 6, $L_F$=2 d tan(arcsin(1/$n_1$))+D tan(arcsin(1/$n_1$)) is plotted with $n_1$=1.5 and the thickness of the sealing member 28 (D=0.2 mm). As can be seen from FIG. 6, in order to prevent the reflected light from leaking to the rear side, it is necessary to increase the width LF of the wide portion of the light shielding film 42 as the thickness d of the substrate 23 increases. For example, when the thickness d of the substrate 23 is 0.05 mm to 1.0 mm, it is necessary to set the width $L_F$ of the wide portion of the light shielding film 42 to 0.27 mm to 2.0 mm or more.

Figure 7:
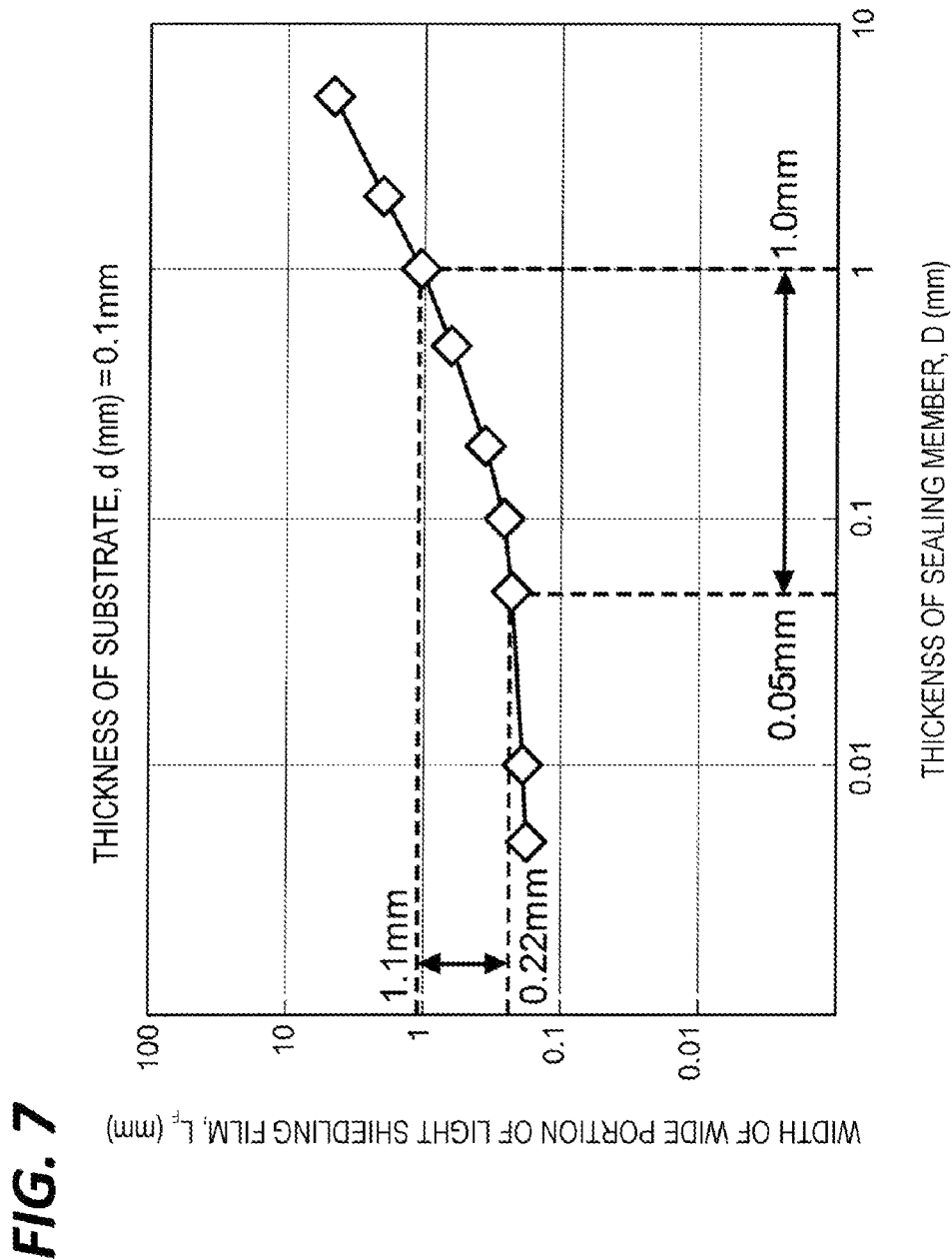
FIG. 7 is a view illustrating a relationship between the thickness of a sealing member and the width of the wide portion of the light shielding film.

FIG. 7 is a view illustrating a relationship between the thickness D of the sealing member 28 and the width $L_F$ of the wide portion of the light shielding film 42. In FIG. 7, $L_F$=2 d tan(arc sin(1/$n_1$))+D tan(arc sin(1/$n_1$)) is plotted with $n_1$=1.5 and the thickness of the substrate 23 (d=0.1 mm). As can be seen from FIG. 7, in order to prevent the reflected light from leaking to the rear side, it is necessary to increase the width $L_F$ of the wide portion of the light shielding film 42 as the thickness D of the sealing member 28 increases. For example, when the thickness D of the sealing member 28 is 0.05 mm to 1.0 mm, it is necessary to set the width $L_F$ of the wide portion of the light shielding film 42 to 0.22 mm to 1.1 mm or more.

Figure 8:
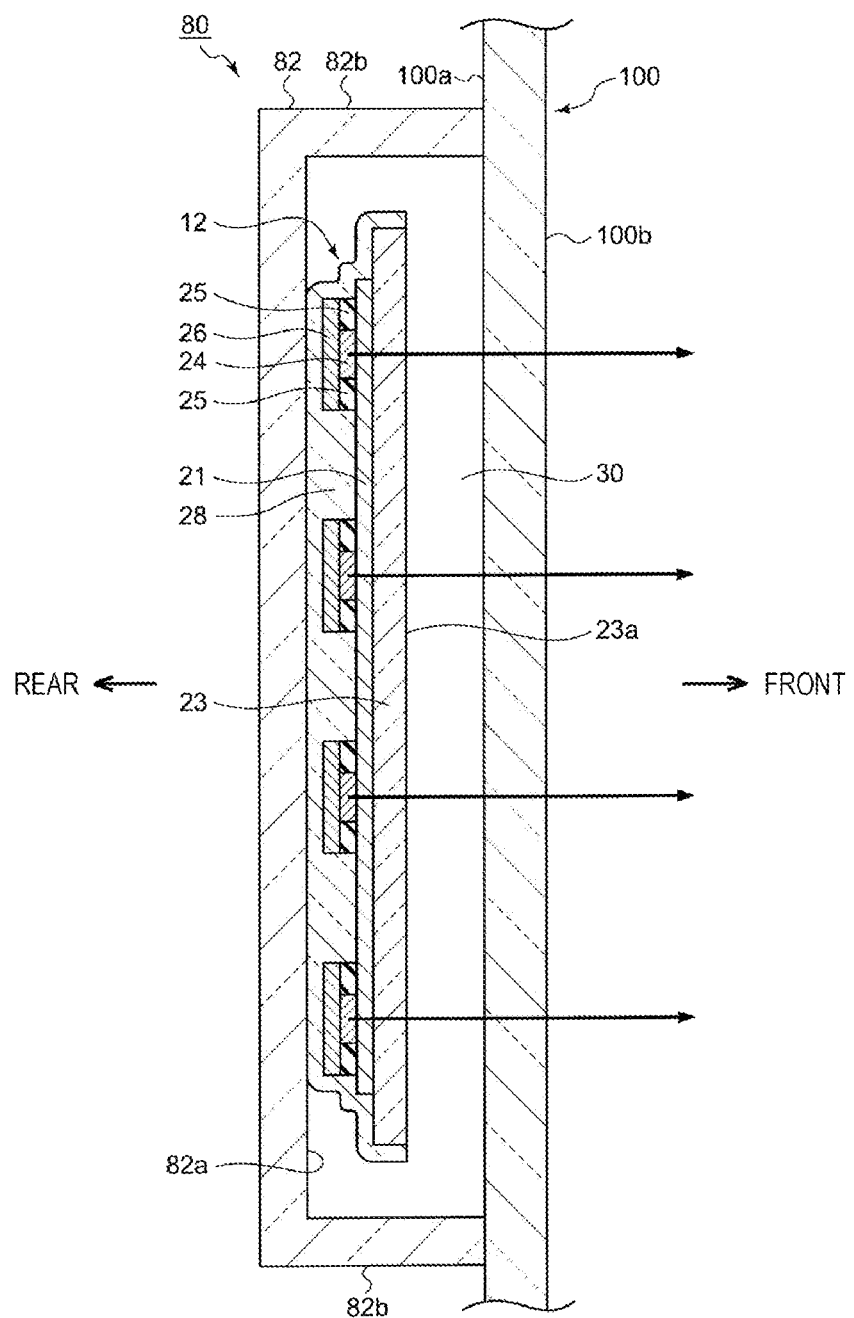
FIG. 8 is a schematic cross-sectional view of a light emitting device according to still another exemplary embodiment of the present disclosure.

FIG. 8 is a schematic cross-sectional view of a light emitting device 80 according to still another exemplary embodiment of the present disclosure. The light emitting device 80 illustrated in FIG. 8 is also disposed along a transparent member 100, such as a rear window of a vehicle, and may be used as a vehicular lamp such as, for example a high mount stop lamp or a tail lamp.

The light emitting device 80 includes an organic EL panel 12 and a transparent frame 82 as an attachment structure that attaches the organic EL panel 12 to the transparent member 100. The transparent frame 82 is a rectangular frame having a bottom made of a transparent resin, and a sealing member 28 of the organic EL panel 12 is attached to the bottom surface 82a of the transparent frame 82. The transparent frame 82 includes support portions 82b, and when the support portions 82b are attached to a first surface 100a of the transparent frame 100, the organic EL panel 12 is fixed. The support portions 82b of the transparent frame 82 are formed such that the substrate 23 of the organic EL panel 12 and the transparent member 100 are spaced apart from each other at a predetermined distance. As a result, an air layer 30 is formed between the substrate 23 and the transparent member 100.

In all of the light emitting device 10 illustrated in FIG. 1, the light emitting device 40 illustrated in FIG. 4, and the light emitting device 80 illustrated in FIG. 8, the air layer 30 is formed between the substrate 23 of the organic EL panel 12 and the transparent member 100. When the air layer is not formed between the substrate 23 of the organic EL panel 12 and the transparent member 100, and for example, a tape having a similar refractive index to that of the substrate 23 and that of the transparent member 100 is placed between the substrate 23 and the transparent member 100, the light reflected at the light emitting surface 23a of the substrate 23 or the first surface 100a of the transparent member 100 decreases, but there is a possibility that the light reflected at the second surface 100b of the transparent member 100 passes through the cathodes 26 in the form of stripes and leaks to the rear side. Therefore, in the light emitting device according to the above-described exemplary embodiment, the air layer 30 is intentionally formed between the substrate 23 of the organic EL panel 12 and the transparent member 100 so as to make the light reflected at the first surface 100a of the transparent member 100 hardly leak to the rear side. The thickness of the air layer 30 may be about 50 µm to 10 cm. According to a simulation performed by the present inventors, when the thickness of the air layer 30 is 50 µm or less, the light leaking backward tends to increase. Further, in consideration of mounting the light emitting device on the vehicle, it is not realistic to form the thickness of the air layer 30 too large, and it is preferable to set the thickness to 10 cm or less. In addition, since the light reflected at the light emitting surface 23a of the substrate 23 is shielded by the cathodes 26 or the light shielding films 42 as described above, the light hardly leaks to the rear side.

In the above-described exemplary embodiment, although the air layer 30 is formed between the substrate 23 of the organic EL panel 12 and the transparent member 100, any layer may be formed without being limited to the air layer as long as the layer has a refractive index lower than that of the substrate 23.

Figure 9A:
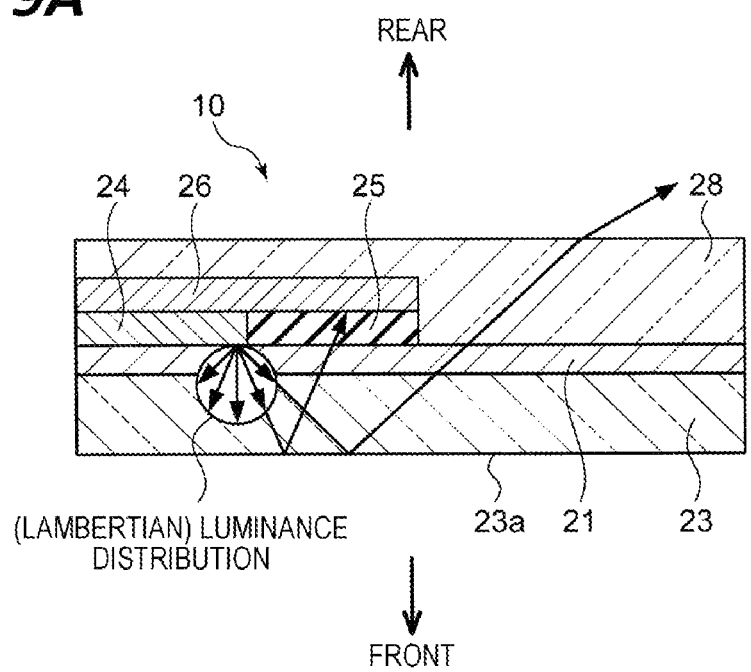
FIGS. 9A and 9B are views for explaining a modified example of the light emitting device.
Figure 9B:
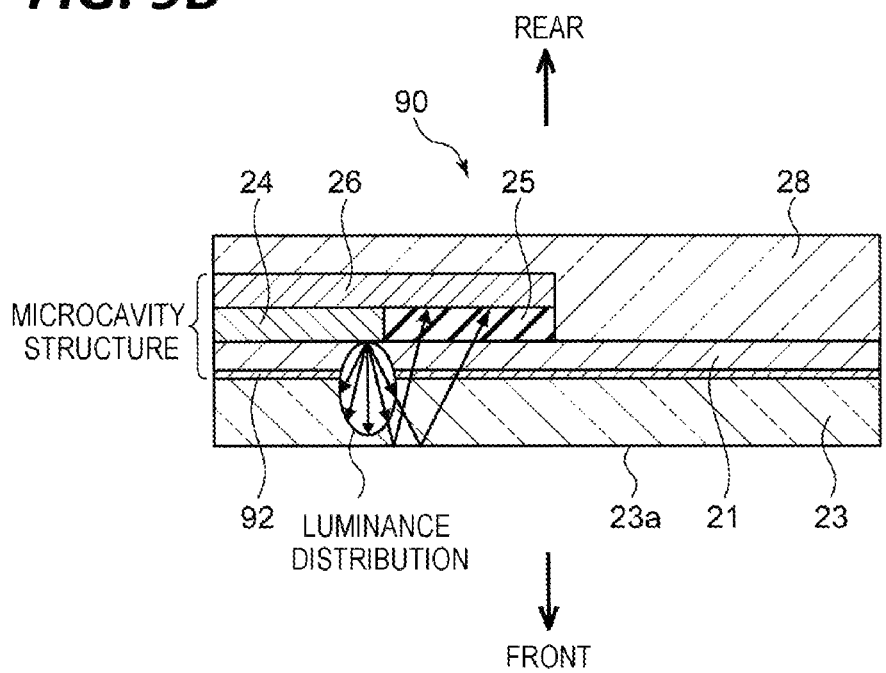

FIGS. 9A and 9B are views for explaining a modified example of a light emitting device. FIG. 9A illustrates the light emitting device 10 explained in FIG. 1. FIG. 9B illustrates a light emitting device 90 according to the modified example.

The light emitting device 10 illustrated in FIG. 9A has a laminated structure in which a cathode 21, an organic material layer 24, and an anode 26 are laminated in this order on a substrate 23. In the case of the laminated structure, the luminance distribution of the light emitted from the organic material layer 24 is a Lambertian distribution.

The light emitting device 90 illustrated in FIG. 9A has a microcavity structure in which a half mirror 92, an anode 21, an organic material layer 24, and a cathode 26 are laminated in this order on the substrate 23. This microcavity structure intensifies and selects the light of a specific wavelength through the multiple reflection of the light emitted from the organic material layer 24. Such a microcavity structure has a luminance distribution in which the front direction is high and a direction other than the front direction is low.

In the light emitting device 10 illustrated in FIG. 9A, among the light heading toward the direction other than the front direction, the light having a small incident angle on the light emitting surface 23a of the substrate 23 is shielded by the wide portion of the cathode 26 after being reflected at the light emitting surface 23a. However, when a sufficient width of the anode 26 is not ensured as explained in FIG. 2, the light having a large incident angle may not be shielded, after being reflected at the light emitting surface 23a, and may leak to the rear side.

In the meantime, the light emitting device 90 illustrated in FIG. 9B adopts the microcavity structure so that the luminance of the light having a large incident angle on the light emitting surface 23a decreases. Therefore, the light that leaks to the rear side after being reflected at the light emitting surface 23a may be reduced. Conversely, according to the light emitting device 90 of this modified example, even if the width of the anode 26 is not made as large as that of the light emitting device 10 illustrated in FIG. 9A, the light leaking to the rear side may be reduced. That is, according to the light emitting device 90 of this modified example, since an aperture ratio may be improved by decreasing the width of the anode 26, a light emitting device with high light transmission can be implemented.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A light emitting device disposed along a transparent member, the light emitting device comprising:
    an organic electroluminescence (EL) panel including a transparent substrate disposed to face the transparent member, a translucent anode disposed on the substrate, an organic material layer disposed on the anode, insulating layers formed on opposite sides of the organic material, and a non-translucent cathode disposed on the organic material layer and the insulating layers,
    wherein the organic material layer and the cathode are each formed in a form of stripes having a length and width, the width of the organic material layer including first and second width end portions that each extend in directions parallel to a front surface of the transparent substrate, and the width of the cathode including first and second width end portions that each extend in directions parallel to the front surface of the transparent substrate, and
    the cathode is formed wider than the organic material layer such that the first and second end portions of the cathode width extend greater along directions parallel to the front surface of the transparent substrate than the respective width end portions of the organic material.

2. A light emitting device disposed along a transparent member, the light emitting device comprising:
    an organic EL panel including a translucent substrate disposed to face the transparent member, a translucent anode disposed on the substrate, an organic material layer disposed on the anode, a non-translucent cathode disposed on the organic material layer, a sealing member configured to cover the organic material layer and the cathode, and a light shielding film formed on the sealing member,
    wherein the organic material layer and the light shielding film are each formed in a form of stripes having a length and width, each width including first and second end portions, and
    the light shielding film is formed wider than the organic material layer such that the first and second end portions of the light shielding film width extend greater than the respective width end portions of the organic material.

3. The light emitting device of claim 1, further comprising:
    an attachment structure configured to attach the organic EL panel to the transparent member such that a layer of a material having a refractive index lower than that of the substrate is formed between the transparent member and the substrate.

4. The light emitting device of claim 2, further comprising:
    an attachment structure configured to attach the organic EL panel to the transparent member such that a layer of a material having a refractive index lower than that of the substrate is formed between the transparent member and the substrate.

5. The light emitting device of claim 1, wherein the organic EL panel includes a microcavity structure having a half mirror, the anode, the organic material layer, and the cathode which are laminated in this order on the substrate.

6. The light emitting device of claim 2, wherein the organic EL panel includes a microcavity structure having a half mirror, the anode, the organic material layer, and the cathode which are laminated in this order on the substrate.

7. The light emitting device of claim 3, wherein the organic EL panel includes a microcavity structure having a half mirror, the anode, the organic material layer, and the cathode which are laminated in this order on the substrate.

8. The light emitting device of claim 4, wherein the organic EL panel includes a microcavity structure having a half mirror, the anode, the organic material layer, and the cathode which are laminated in this order on the substrate.

9. The light emitting device of claim 1, wherein assuming that a refractive index of the substrate is n1 and a thickness of the substrate is d, a width LN of a portion wider than the organic material layer in the cathode is defined by an expression as follows:

$LN \geq 2d \tan(\arcsin(1/n1))$.

10. The light emitting device of claim 2, wherein assuming that a refractive index of the substrate is n1, a thickness of the substrate is d, and a thickness of the sealing member is D, a width LF of a portion wider than the organic material layer in the light shielding film is defined by an expression as follows:

$LF \geq 2d \tan(\arcsin(1/n1)) + D\tan(\arcsin(1/n1))$.

11. The light emitting device of claim 1, wherein among light emitted from the organic material, light directed to the anode passes through the anode and is emitted from a forward side of a light emitting surface of the substrate; and light directed to the cathode is reflected by the cathode such that the light directed to the cathode is only emitted towards the forward side.

12. The light emitting device of claim 2, wherein among light emitted from the organic material, light directed to the anode passes through the anode and is emitted from a forward side of a light emitting surface of the substrate; and light reflected at the light emitting surface towards the light shielding film is shielded by the light shielding film.

13. The light emitting device of claim 2, wherein the first and second width end portions of the organic material layer each extend in directions parallel to a front surface of the transparent substrate and the first and second width end portions of the light shielding film each extend in directions parallel to a front surface of the transparent substrate.

* * * * *